United States Patent [19]

Eckton, Jr.

[11] 3,793,088

[45] Feb. 19, 1974

[54] COMPATIBLE PNP AND NPN DEVICES IN AN INTEGRATED CIRCUIT

[75] Inventor: Wallace Henry Eckton, Jr., Reading, Pa.

[73] Assignee: Bell Telephone Laboratories, Incorporated, Murray Hill, N.J.

[22] Filed: Nov. 15, 1972

[21] Appl. No.: 306,924

[52] U.S. Cl. .................. 148/1.5, 148/175, 148/187, 317/235

[51] Int. Cl. .............................................. H01l 7/54

[58] Field of Search ............... 148/1.5 CP, 175, 187; 317/235 R

[56] References Cited

UNITED STATES PATENTS

| | | | |
|---|---|---|---|
| 3,617,824 | 11/1971 | Schmitz et al. | 317/235 |
| 3,648,130 | 3/1972 | Castrucci et al. | 317/235 R |
| 3,723,199 | 3/1973 | Vora | 148/187 X |
| 3,729,811 | 5/1973 | Beale et al. | 148/1.5 X |
| 3,747,203 | 7/1973 | Shannon | 148/1.5 X |
| 3,748,545 | 7/1973 | Beale | 148/175 X |

OTHER PUBLICATIONS

"FET–Bipolar Integration," Vora, IBM Tech. Discl. Bull. Vol. 13, No. 5, Oct. 1970 p. 1106.

*Primary Examiner*—Hyland Bizot
*Assistant Examiner*—J. M. Davis
*Attorney, Agent, or Firm*—H. W. Lockhart

[57] ABSTRACT

Compatible, matched, complementary semiconductor devices are fabricated in a common semiconductor body using a combination of oxide-masked diffusion, epitaxial deposition and photoresist-masked, ion implantation. A pair of zones of opposite conductivity type are formed in a high resistivity substrate by sequential oxide-masked diffusion, ion implantation, epitaxial deposition and subsequent out-diffusion. Using a series of photoresist masks, successive ion-implantation steps of P- and N-type impurities produce the base and emitter zones of the complementary transistors as well as zones of enhanced conductivity for connecting to the collector zone.

5 Claims, 13 Drawing Figures

HIGH RESISTIVITY SUBSTRATE

SEQUENTIAL DIFFUSION (N+P) SELECTIVELY

SEQUENTIAL ION IMPLANT (N & P) SELECTIVELY

DEPOSIT EPITAXIAL LAYER OF HIGH RESISTIVITY
AND FORM STEPPED OXIDE FILM

DEPOSIT METAL CONTACTS

COMPATIBLE PNP AND NPN DEVICES IN AN INTEGRATED CIRCUIT

This invention relates to semiconductor integrated circuits and, more particularly, to a method of fabricating semiconductor integrated circuits having compatible, matched, complementary devices in the same semiconductor body.

BACKGROUND OF THE INVENTION

There are a wide variety of circuit applications in which semiconductor integrated circuits having complementary devices are desirable. Complementary, in this instance, refers to devices having the same geometric configuration but with reversed conductivity-type zones. Semiconductor integrated circuit arrangements of this kind are widely known in the art and involve a great variety of techniques for their fabrication.

However, insofar as applicant is aware, the art does not provide the structure and the method for making such structure in which complementary devices are fabricated in a common semiconductor body to be electrically compatible and matched from the standpoint of electrical characteristics. Closely matched devices of complementary configuration should be substantially symmetrical in geometric configuration as well as in impurity concentration levels and gradients. Matching of these structural arrangements produces more closely matched parameters because it provides a closer correspondence of operating parameters based on current densities, consequently tending to reduce parasitic unbalances.

However, in complementary integrated semiconductor devices of the prior art, it is generally the practice to form simultaneously, noncomplementary zones of the several devices. That is, particularly when using solid state diffusion, the base zone of one device is formed, for example, at the same time as the emitter zone of the complementary device. Likewise, it is a standard technique to determine the base width, that is, the distance between the emitter and collector P-N junctions, by an out-diffusion process from a buried layer in a substrate portion in one device; whereas in the so-called complementary device, this same dimension is determined by an impurity placement technique from the upper surface of the structure rather than from the substrate. Process steps of this nature with respect to the so-called complementary device tend to render them nonsymmetrical and produce devices which are not at all matched from the standpoint of electrical characteristics and response.

Accordingly, an object of this invention is a method for conveniently fabricating compatible, electrically matched, complementary semiconductor devices in a common substrate.

SUMMARY OF THE INVENTION

In accordance with this invention, compatible, matched, complementary semiconductor devices are fabricated in a common semiconductor body using a combination of oxide-masked diffusion, epitaxial deposition, and photoresist-masked, ion implantation. In one embodiment, a pair of zones of opposite conductivity type are formed in a high resistivity substrate by sequential oxide-masked diffusion. A sequential ion-implantation step increases the impurity concentration of the surface portion of each of these conductivity-type zones to provide an impurity source for subsequent out-diffusion.

An epitaxially deposited layer of high resistivity semiconductor material then is formed on the diffused and implanted surface of the substrate. During this step, which requires heat, and in a subsequent heating step, the impurities from the zone of increased conductivity diffuse through the adjoining portion of the epitaxial layer thus forming the separated zones of P- and N-type conductivity in the common substrate. The surface of the epitaxial layer then is covered with an oxide film and, using a series of photoresist masks, successive ion-implantation steps of P- and N-type impurities, produce the base and emitter zones of the complementary transistors as well as zones of enhanced conductivity for connecting to the collector zone. Thus, using such successive ion-implantation steps, a pair of complementary transistors which are substantially symmetrical and having closely matching geometrical configuration and impurity concentration distributions are fabricated.

The method in accordance with this invention is applicable to other embodiments for fabricating complementary semiconductor device structures in addition to transistor pairs. The method is particularly adapted to the production of semiconductor devices capable of relatively high frequency operation which is dependent in major part, upon precise base width and impurity distribution.

BRIEF DESCRIPTION OF THE DRAWING

The invention and its other objects and features will be more clearly understood from the following detailed description taken in conjunction with the drawing in which FIGS. 1A through 1J depict by cross-sectional views of a portion of a semiconductor body, steps in the fabrication of a pair of matched, complementary transistors in integrated form in accordance with this invention.

DETAILED DESCRIPTION

Figure 1A:
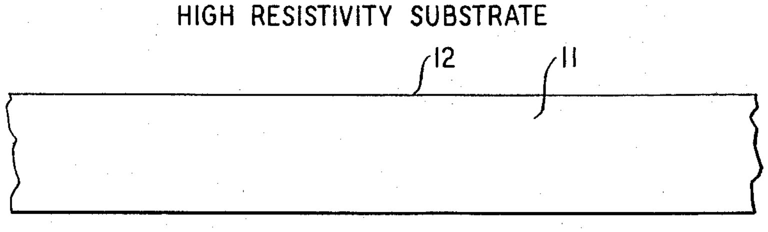

Referring to the drawing, FIG. 1A shows the starting semiconductor material which comprises a portion 11 of high resistivity, single crystal silicon material. The material 11 should be as near intrinsic as possible and may be either slightly N- or P-type. The slice portion 11 may be of about 2 to 3 mils in thickness and have at least one surface 12 which is highly polished and as planar as possible.

Figure 1B:
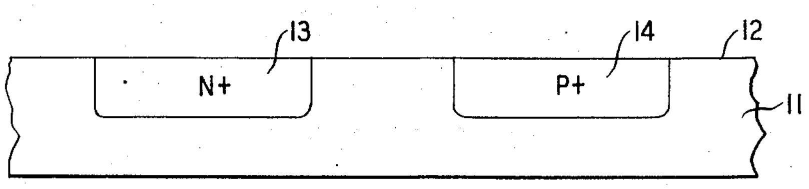

Using oxide-masked diffusion, with masks formed by well-known photoresist techniques, a pair of zones 13 and 14, respectively, one N-type and the other of P-type conductivity are formed as shown in FIG. 1B. In particular, the N-type zone 13 is formed by a high concentration arsenic or antimony diffusion and the P-type zone 14 by a high concentration boron diffusion. Both zones 13 and 14 will have an impurity gradient characteristic of solid state diffused zones which decreases from a high value near the surface 12 to a lesser value at the diffusion front.

Figure 1C:
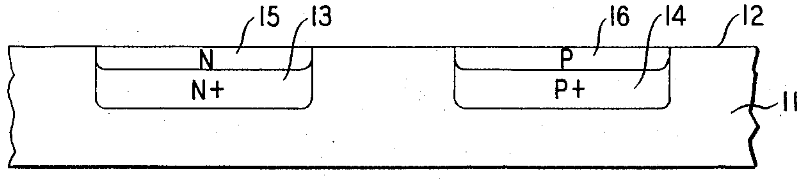

In order to provide a copious supply of the impurity atoms for subsequent out-diffusion, additional impurities are implanted in the surface portions of both zones 13 and 14, as shown in FIG. 1C. A zone 15 of increased N-type conductivity is formed in a surface portion of zone 13 by a controlled implanted dose of phosphorus. Similarly, the P-type zone 16 of increased conductivity is formed by a controlled implanted dose of gallium. These implantation steps are conveniently carried out in succession, using a masking layer of a standard photoresist material.

Figure 1D:
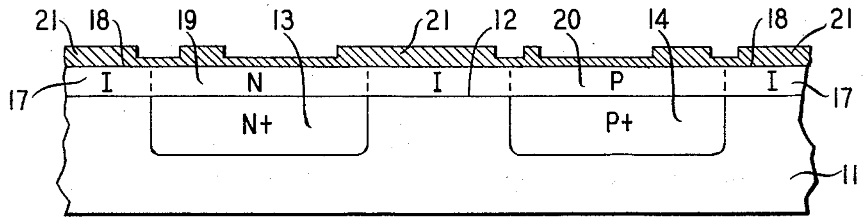

Referring to FIG. 1D, the next major step in the process in accordance with this invention is the deposition of an epitaxial layer 17 of silicon semiconductor material on the surface 12 of the substrate 11. The vapor deposition of epitaxial layers of semiconductor material is well known in the art and in this instance, the deposited layer 17, like the original substrate, should be as near intrinsic as possible. During the deposition step, which customarily involves relatively high heat, there will be a diffusion of significant impurities from the substrate 11 into the deposited layer 17 as it is formed. As a consequence, there is produced an N-type zone 19 and a P-type zone 20 in the portion of the layer 17 adjoining the zones 13 and 14 in the substrate. The portions 15 and 16 of increased impurity concentration provide the sources for this out-diffusion. In some instances it may be advantageous to subject the slice to a separate annealing heat treatment following the epitaxial deposition to insure a controlled distribution of the impurities through the zones 13–19 and 14–20, thus providing an adequate impurity concentration at the final upper surface 18 of the deposited layer. Also, as shown in FIG. 1D, a layer 21 of silicon dioxide is formed on the surface 18 either by a preferred thermal growth technique or by an alternative deposition process.

The layer 21 has a thickness of about 5,000 angstroms except over the portions through which impurities are to be ion implanted subsequently, to produce the base zones and collector contact zones. In those portions a thickness of about 1,000 angstroms is desirable and is achieved conveniently by masking and etching entirely through the silicon oxide layer and then reforming the desired 1,000 angstrom thick portion in those windows. Alternatively, controlled etching could be used to reduce the thickness to that desired, thus eliminating the reforming step. The reduced thickness of the layer 21 in the window portions is desirable in order to reduce the amount of energy required for ion implantation.

Figure 1E:
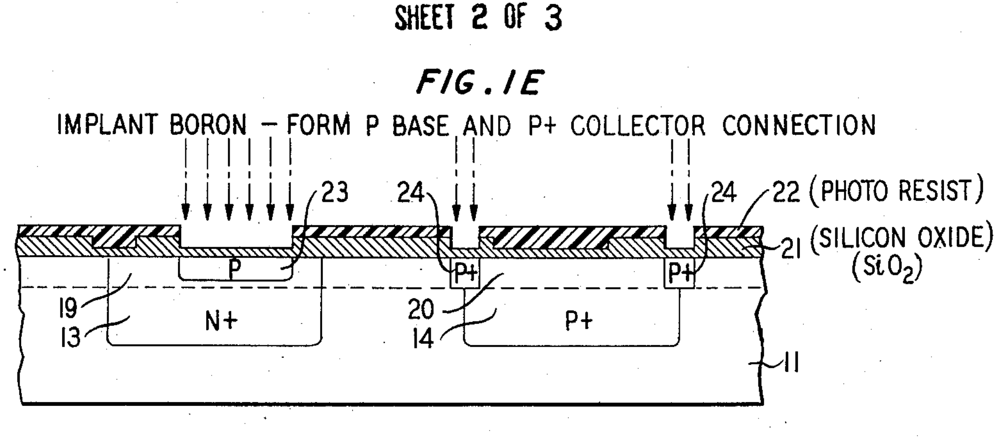

Referring to FIG. 1E, a film 22 of photoresist material is formed on the silicon oxide layer as a mask to enable the formation of the P-type base zone 23 and the P-type collector connection zone 24. The P-type base zone 23 is formed by ion implantation using boron into a limited surface portion of the projected zone 19 and is included entirely within the projected zone. The P-type collector connection zone 24 appears in the section view of FIG. 1E as effectively straddling the peripheral junction boundary of the P-type projected zone 20 and is itself of a peripheral or ring-like configuration. In this form the P-type collector connection zone 24 not only serves the primary purpose of enabling low resistance connection from the surface of the semiconductor to the underlying higher conductivity collector zone 14, but also serves to prevent surface leakage currents induced by inversion of the surface portions of the projected zone 20. Both the P-type zone 23 and the P-type collector connection zone 24 may be produced using a dose per square centimeter of about $5\times10^{13}$ to $5\times10^{14}$ so as to ultimately produce P-type zones having a depth of about 0.3 microns.

Figure 1F:
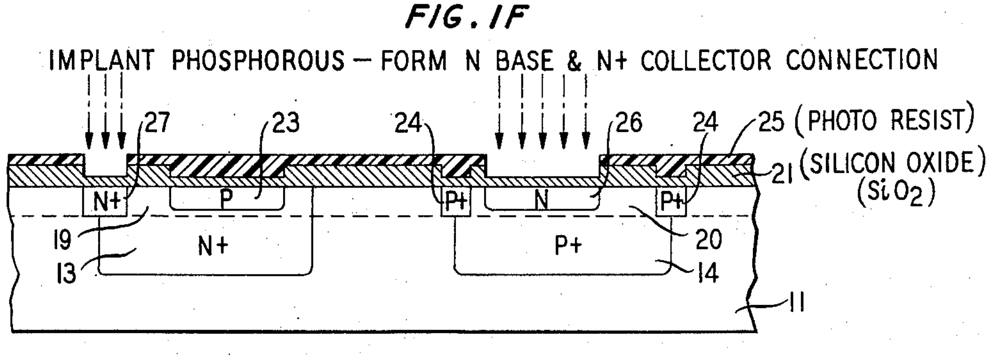

Next, as shown in FIG. 1F, a photoresist mask 25 is newly formed to define a window for ion implanting the N-type base zone 26 and the N-type collector connection zone 27. This step corresponds substantially to that used above for forming the P-type zones 23 and 24, substituting however, phosphorus in place of boron as the significant impurity. A similar dosage produces substantially similar dimensions. However, the configuration of the N-type collector connection zone 27 differs from the corresponding P-type collector connection zone 24 in that it is not of a peripheral geometry and functions only as a low resistance connection to the underlying collector zone 13, inversion of the surface portion of N-type projected zone 19 being of little concern in low voltage applications.

The dimensions set forth above for this first series of implanted conductivity type zones are dependent finally upon subsequent heating or annealing treatment. After the implantation of the N-type zones 26 and 27, the photoresist film 25 is stripped from the surface and a pair of dielectric layers comprising a silicon oxide layer 28 and an overlying layer 29 of silicon nitride are formed. As indicated previously, thermal growth is the preferred technique to form the silicon oxide layer 28 and the silicon nitride layer 29 is formed using one of several pyrolytic decomposition methods well known in the art involving either silicon tetrachloride and ammonia or silicon hydride. Inasmuch as both of these dielectric formation processes involve heat, they generally may constitute the annealing heat treatment for the ion-implantation steps set forth above and will produce the necessary penetration and distribution of the implanted impurities. At this juncture it is advantageous to open windows through both dielectric layers 28 and 29 to define not only the emitter zone areas but also all of the areas to which ohmic contacts are to be subsequently made. This is conveniently done in accordance with one well-known method by forming a silicon oxide mask of the desired configuration using photolithography on the surface of the silicon nitride layer 29. Using a silicon oxide mask, portions of the silicon nitride layer 29 then are removed with hot phosphoric acid. Finally, the dielectric coated surface is dipped in a buffered solution of hydrofluoric acid which removes the silicon oxide mask and the exposed portions of the silicon oxide layer 28, thus opening the desired windows through the double dielectric film.

Figure 1G:
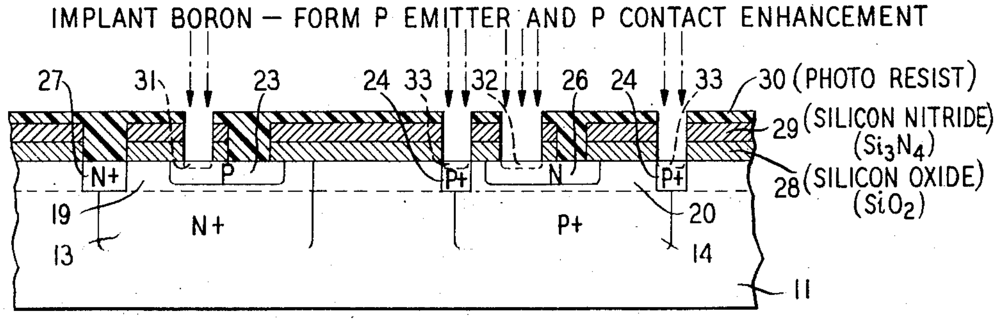

Referring to FIG. 1G, a photoresist film 30 is formed in a pattern to define the ion implantation of P-type emitter zone 32 and shallow P-type contact enhancement zones 31 and 33. These latter zones 31 and 33 are of increased conductivity and enable ohmic contact to be made subsequently by appropriate metallization to the P-type base zone 23 and P-type collector connection zone 24, respectively. This P-type conductivity ion-implantation step likewise utilizes boron, typically at a dose per square centimeter of about $1\times10^{15}$, which after appropriate annealing, provides an emitter zone 32 having a depth of about 0.2 microns.

Figure 1H:
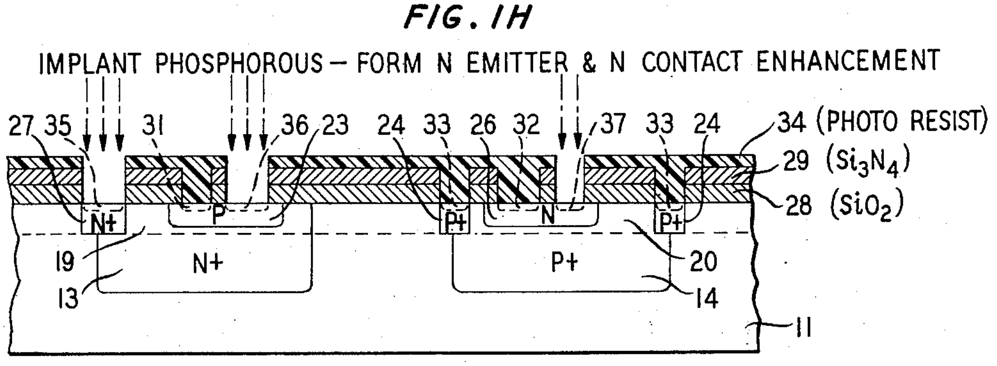

As shown in FIG. 1H, the procedure described in connection with FIG. 1G is repeated, using a reconstituted photoresist mask 34 and a phosphorus ion implantation to produce the N-type emitter zone 36 and N-type contact enhancement zones 35 and 37. Following these ion-implantation steps, the structure is subjected to an annealing heat treatment to produce the final zone dimensions described above and typically may comprise heating at about 875°C for about 45 minutes or, alternatively, at about 900°C for about 30 minutes.

Figure 1J:
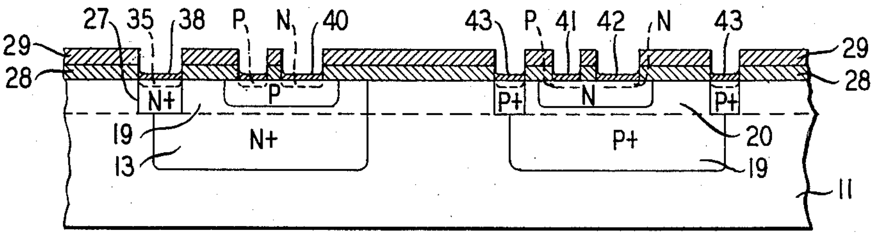

Finally, as shown in FIG. 1J, the series of metallic contacts 38, 39, 40, 41, 42 and 43 are formed to constitute ohmic connection to the three terminals of each of the pair of substantially symmetrically matched, complementary transistors. This metallization may follow well-known procedures known in the art, one advantageous technique involving an initial deposition of a thin film of platinum which is sintered to produce platinum silicide contacts in each of the contact areas 38, 39, 40, 41, 42 and 43. Following this step, a series of metals may be deposited, such as titanium, platinum and gold, which finally may be formed in an interconnection pattern overlying the dielectric films 28 and 29 and thus enable interconnection of the two transistors as well as their connection to other electronic elements.

From the foregoing description, it is apparent that the method in accordance with this invention, involving a combination of solid state diffusion, epitaxial deposition and ion implantation, produces a pair of truly complementary devices having corresponding conductivity type zones of matching dimensions and electronic characteristics enabling truly complementary electronic performance. Such a pair of complementary transistors, for example, are particularly useful in applications requiring a balanced amplifier where it is particularly advantageous to operate with a single power supply.

It will be noted that inasmuch as the above-described structure is fabricated using both substrate and epitaxially deposited layers of near intrinsic semiconductor material, other means of electrical isolation between devices is ordinarily not required at the typical low voltage applications of about 5 volts and for frequencies in the neighborhood of 1 gigahertz. However, it will be apparent that, for some applications, types of isolation between devices as known in the art, such as P-N junction isolation and dielectric isolation may be used. In the above-described structure, the spacing between the collector zones adjoining complementary devices under the conditions described may be about 50 microns or more.

Figure 2A:
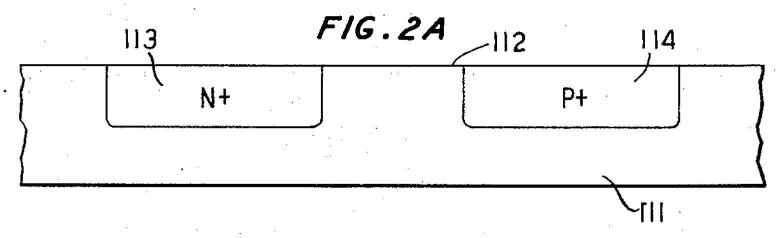
FIGS. 2A through 2D depict in like fashion the initial steps of an alternative process for fabricating a pair of complementary transistors.
Figure 2B:
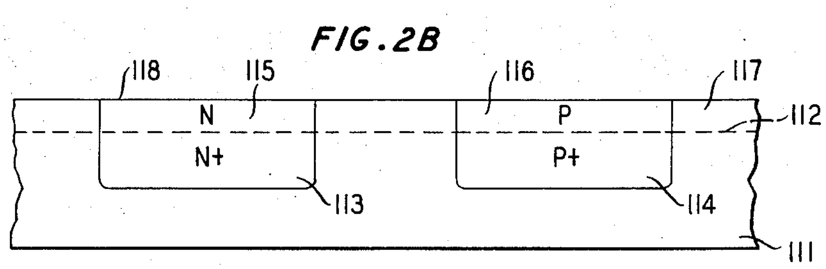
Figure 2C:
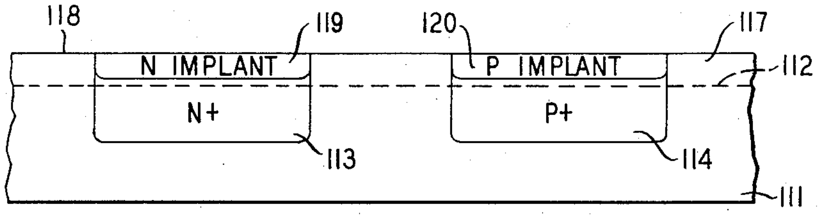
Figure 2D:
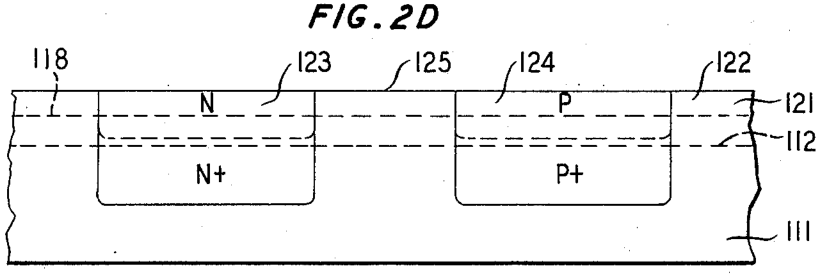

As an alternative process to assure devices of improved characteristics, particularly with respect to collector series resistance, a double epitaxial process may be employed. The structure shown in FIG. 2A is comparable to the structure of FIG. 1B in which N- and P-type zones have been formed in a high resistivity substrate 111. As shown in FIG. 2B, an epitaxial layer 117 is formed on the top surface 112 of the substrate and out-diffusion forms N- and P-type zones 115 and 116, respectively. Then, as shown in FIG. 2C, surface portions 119 and 120 are formed with increased impurity concentration, using ion implantation. A second epitaxial deposition step, as illustrated in FIG. 2D then results in an additional layer 121 on the surface 118 of the first epitaxial layer. Out-diffusion of the ion-implanted impurities provides a sufficiently high impurity concentration to provide the structure in which the pair of complementary transistors then are formed in the same fashion as described in connection with FIGS. 1E through 1J.

What is claimed is:

1. A method of fabricating a semiconductor integrated circuit including compatible PNP and NPN devices comprises a. providing a substrate portion of a semiconductor material of one conductivity type and of high resistivity, b. forming adjacent one major surface of said substrate a first zone of one conductivity type and a second zone of opposite conductivity type, c. enhancing the conductivity of a surface portion of each of said first and second zones, d. depositing on said one major surface of said substrate an epitaxial layer of said semiconductor material of relatively high resistivity, e. heating the semiconductor body at a temperature and for a time to diffuse the impurities from the surface portions of said first and second zones through the respective adjoining portions of said epitaxial layer thereby forming projected first and second conductivity type zones to the surface of said epitaxial layer, and f. forming by ion implantation in a limited surface adjacent portion of each said projected first and second zones respectively, first and second ion-implanted zones each of a conductivity type opposite to that of the contiguous projected first and second zones and each being entirely included within its respective projected zone and defining a P-N junction therewith, said first and second ion-implanted zones having substantially identical dimensions, g. forming by ion implantation in a limited surface adjacent portion of said first and second ion-implanted zones, third and fourth ion-implanted zones respectively, each of a conductivity type opposite to that of the contiguous first and second ion-implanted zones and each being entirely included with its respective first and second ion-implanted zone and defining a P-N junction therewith, said third and fourth ion-implanted zones being of substantially identical dimensions.

2. The method in accordance with claim 1 including the additional step of forming ohmic connections to each of said projected first and second zones and first, second, third and fourth ion-implanted zones.

3. The method in accordance with claim 1 in which step (b) comprises successive masked diffusion steps and step (c) comprises successive ion-implantation steps.

4. The method in accordance with claim 1 in which step (e) occurs during the deposition process of step (d).

5. The method in accordance with claim 1 in which an annealing heat treatment occurs following step (f) and during the formation of a dielectric film on a surface portion of the semiconductor body.

* * * * *